United States Patent
Gotoh et al.

(10) Patent No.: US 6,875,288 B2
(45) Date of Patent: Apr. 5, 2005

(54) CLEANING AGENT AND CLEANING METHOD

(75) Inventors: Hideto Gotoh, Ibaraki (JP); Takayuki Niuya, Ibaraki (JP); Hiroyuki Mori, Yamanashi (JP); Hiroshi Matsunaga, Ibaraki (JP); Fukusaburo Ishihara, Saitama (JP); Yoshiya Kimura, Ibaraki (JP); Ryuji Sotoaka, Ibaraki (JP); Takuya Goto, Ibaraki (JP); Tetsuo Aoyama, Niigata (JP); Kojiro Abe, Niigata (JP)

(73) Assignees: Tokyo Electron Limited, Tokyo (JP); Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 09/971,589

(22) Filed: Oct. 9, 2001

(65) Prior Publication Data

US 2002/0064963 A1 May 30, 2002

(30) Foreign Application Priority Data

Oct. 10, 2000 (JP) ........................................ 2000-309171

(51) Int. Cl.$^7$ .............................................. B08B 3/00
(52) U.S. Cl. ............................... 134/34; 134/2; 134/10; 510/175; 510/176; 510/178; 510/201; 510/467
(58) Field of Search .............................. 134/2, 10, 34, 134/36, 38, 40, 902, 42; 510/175, 176, 178, 201, 467

(56) References Cited

U.S. PATENT DOCUMENTS

| | | | |
|---|---|---|---|
| 4,410,396 A | | 10/1983 | Somers et al. ............... 156/664 |
| 4,536,267 A | * | 8/1985 | Ito et al. ......................... 522/13 |
| 4,778,532 A | * | 10/1988 | McConnell et al. ........... 134/10 |
| 4,899,767 A | | 2/1990 | McConnell et al. ...... 134/56 R |
| 4,911,761 A | | 3/1990 | McConnell et al. .......... 134/11 |
| 4,917,123 A | * | 4/1990 | McConnell et al. ..... 134/100.1 |
| 4,983,224 A | * | 1/1991 | Mombrun et al. ............. 134/40 |
| 5,039,349 A | * | 8/1991 | Schoeppel .................... 134/26 |
| 5,203,798 A | * | 4/1993 | Watanabe et al. ........... 134/184 |
| 5,236,515 A | | 8/1993 | Ueno et al. ................. 134/25.4 |
| 5,286,657 A | * | 2/1994 | Bran ........................... 134/1.3 |
| 5,411,595 A | * | 5/1995 | Bokisa et al. ................... 134/2 |
| 5,445,706 A | * | 8/1995 | Okuno et al. .......... 156/345.11 |
| 5,556,479 A | * | 9/1996 | Bran ........................... 134/1.3 |
| 5,882,433 A | | 3/1999 | Ueno .............................. 134/31 |
| 5,934,566 A | | 8/1999 | Kanno et al. ................ 239/398 |
| 5,972,862 A | * | 10/1999 | Torii et al. ................... 510/175 |
| 6,030,932 A | | 2/2000 | Leon et al. ................. 510/175 |
| 6,143,705 A | | 11/2000 | Kakizawa et al. .......... 510/175 |
| 6,265,309 B1 | * | 7/2001 | Gotoh et al. ................. 438/637 |
| 6,277,749 B1 | | 8/2001 | Funabasshi .................. 438/684 |
| 6,310,020 B1 | * | 10/2001 | Shirota et al. ................. 430/33 |
| 6,323,169 B1 | | 11/2001 | Abe et al. .................... 560/176 |
| 6,458,517 B2 | * | 10/2002 | Nohara et al. .............. 430/329 |
| 2001/0054706 A1 | | 12/2001 | Levert et al. ............... 252/79.1 |
| 2002/0064963 A1 | * | 5/2002 | Gotoh et al. ................. 438/738 |
| 2002/0066465 A1 | * | 6/2002 | Gotoh et al. .................... 134/2 |

FOREIGN PATENT DOCUMENTS

| | | |
|---|---|---|
| EP | 1035446 A2 | 9/2000 |
| JP | 10159893 | 12/1999 |

* cited by examiner

Primary Examiner—M. Kornakov
(74) Attorney, Agent, or Firm—Antonelli, Terry, Stout & Kraus, LLP

(57) ABSTRACT

The cleaning agent described above comprises a surfactant and an organic solvent, and the cleaning method described above is characterized by allowing the cleaning agent described above to flow on the surface of the material to be treated at a high speed to thereby clean the above surface. According to the present invention, deposits adhering firmly to a surface of a material to be treated can readily be removed without damaging the material to be treated.

18 Claims, 2 Drawing Sheets

CLEANING AGENT AND CLEANING METHOD

BACKGROUND OF THE INVENTION

The present invention relates to a cleaning agent and a cleaning method for removing deposits on a surface of a material to be treated, specifically to a cleaning agent and a cleaning method for removing deposits adhering firmly to a surface of a material to be treated without damaging the material to be treated.

RELATED ART

When a surface of a material to be treated is cleaned with a cleaning agent, damage such as corrosion has been exerted on the surface of the material to be treated by too strong detergency in a certain case.

For example, a semiconductor integrated circuit and a liquid crystal display are produced by a series of steps of coating a photoresist evenly on an inorganic substrate to provide a photosensitive layer, subjecting this to selective exposure and developing treatment to form a pattern, then using the photoresist pattern as a mask to carry out etching of the inorganic substrate in a non-masked area to form a fine circuit and then completely removing the residual photoresist.

In recent years, high integration in a semiconductor device is advanced, and it has been required to form a pattern of quarter micron or less. As a dimension in such processing goes on toward ultra fineness, it has become difficult to work a circuit at a prescribed speed because a material comprising a principal component of aluminum which has so far been used as a wiring material in many cases has too high resistance, and therefore a simple substance of copper is increasingly used. However, copper is notably oxidized in a method for removing a photoresist film by oxidation in ashing, and the low resistance which is a merit thereof is damaged. Accordingly, it is very important to remove a resist changed in property by etching without damaging a copper wiring material.

It is described in Japanese Patent Application Laid-Open No. 281753/1993 as a method for removing a photoresist film to use a peeling agent comprising principally alkanolamine.

In recent years, however, as a device goes on toward ultra fineness, fluorine base gas is added to chlorine base gas or high density plasma is used, and thus the etching conditions have been getting severe. This has allowed metal components used for a wiring and an insulating film and halogen base gas used for dry etching to remain in a photoresist in large amounts and have made it difficult to remove an unnecessary resist film after etching. Thus, there have been caused various problems that a photoresist film can not readily be removed for short time with the peeling agent described above comprising principally alkanolamine and that carrying out peeling for long time brings about corrosion on the wiring material.

DISCLOSURE OF THE INVENTION

The present invention has been made in order to solve the problems described above, and an object thereof is to provide a cleaning agent and a cleaning method by which deposits adhering firmly to a surface of a material to be treated can readily be removed without damaging the material to be treated.

The present invention provides a cleaning agent for cleaning a surface of a material to be treated by allowing it to flow on the above surface at a high speed, which comprises a surfactant and an organic solvent.

Further, the present invention provides a cleaning method characterized by allowing a cleaning agent comprising a surfactant and an organic solvent to flow on a surface of a material to be treated at a high speed to thereby clean the above surface.

EMBODIMENT OF THE INVENTION

Figure 1:
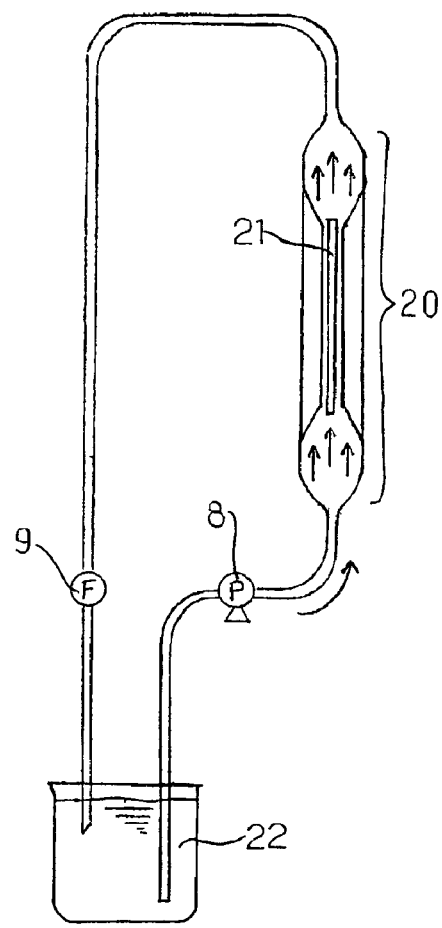
FIG. 1 is a drawing showing a dipping single layer type cleaning apparatus for cleaning a semiconductor device with a high speed stream.

In the cleaning agent and the cleaning method of the present invention, capable of being cleaned as objects thereof are various material to be treateds, for example, various parts including electronic parts such as semiconductor devices, liquid crystal display elements, photodisks, print substrates, plasma displays and field emission displays.

According to the cleaning agent and the cleaning method of the present invention, in peeling a resist film which is coated on a semiconductor substrate and remains after subjected to dry etching or a resist film which remains after subjected to dry etching and then to ashing, a cleaning agent comprising a surfactant and an organic solvent is used to carry out cleaning with a high speed stream, whereby the resist film can readily be peeled off for short time without corroding at all a wiring material and an insulating film. Further, an organic solvent such as alcohol does not have to be used as a rinsing solution, and rinsing can be carried out only with water.

The cleaning agent of the present invention comprises preferably 0.01 to 20% by weight of the surfactant and 80 to 99.9% by weight of the organic solvent. If the surfactant accounts for less than 0.01% by weight, the cleaning agent is short of a detergency, which makes it impossible to remove the residual photoresist for short time. On the other hand, if it exceeds 20% by weight, materials such as the wirings and the insulating film are likely to be corroded.

The surfactant described above includes surfactants of a cation base, a nonion base, an anion base and a fluorine base, and particularly preferred is an anionic phosphoric acid ester base surfactant represented by the following formula:

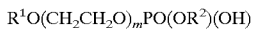

$$R^1O(CH_2CH_2O)_mPO(OR^2)(OH)$$

wherein $R^1$ represents an alkyl group or an alkylaryl group; $R^2$ represents H or a $R^3O(CH_2CH_2O)_n$ group; $R^3$ represents an alkyl group or an alkylaryl group, and $R^1$ and $R^3$ may the same or different; and m and n represent integers. Commercially available are, for example, Plysurfe A207H and A217C (brand names, manufactured by Daiichi Kogyo Seiyaku Co., Ltd.).

The surfactants can be used alone or in combination of two or more kinds thereof and may be a mixture of an anionic surfactant and a nonionic surfactant.

The organic solvent described above includes, for example, ether base solvents such as ethylene glycol monoethyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, propylene glycol monobutyl ether, dipropylene glycol monomethyl ether, dipropylene glycol monoethyl ether, dipropylene glycol monobutyl ether, diethylene glycol dimethyl ether and dipropylene glycol dimethyl ether; amide base solvents such as formamide, monomethylformamide, dimethylformamide, monoethylformamide, diethylformamide, acetamide, monomethylacetamide, N-methylpyrrolidone, N-ethylpyrrolidone, N,N-dimethylformamide and N,N-dimethylacetamide; sulfur compound base solvents such as dimethylsulfoxide, dimethyl-sulfone, diethylsulfone, bis(2-hydroxysulfone) and tetramethylene-sulfone; and alcohol base solvents such as methanol, ethanol, 1-propanol, 2-propanol, 1-hexanol, 1-nonanol, cyclohexanol and benzyl alcohol.

Among them, preferred are dimethylsulfoxide, N,N-dimethylformamide, N,N-dimethylacetamide, N-methylpyrrolidone, diethylene glycol monomethyl ether, diethylene glycol monobutyl ether, methanol and benzyl alcohol. Dimethylsulfoxide and N,N-dimethylformamide are more preferred. The organic solvents described above can be used alone or in combination of two or more kinds thereof and may be selected according to the conditions in dry etching and/or ashing.

As far as an environment in using the cleaning agent according to the present invention is concerned, the good effects can be obtained in a closed space which is as narrow as possible, for example, a space in which a volume of less than 1 liter can be secured, preferably a space which has a volume of less than 200 milliliter and in which a liquid flow amount of 1 liter/second or more, preferably 15 liter/second or more can be secured.

That is, in the cleaning method of the present invention, the residues on the surface of the material to be treated on the semiconductor substrate are removed with high speed stream at a flow speed of preferably 3 to 1000 cm/second, particularly preferably 5 to 100 cm/second and more preferably 5 to 10 cm/second.

As described above, the cleaning agent having a detergency which is not too strong is used in the present invention to carry out high speed stream cleaning, whereby the resist film can readily be peeled off for short time without corroding at all the wiring material and the insulating layer.

A dipping single layer type cleaning apparatus shown in, for example, FIG. 1 is used as a cleaning apparatus in which such high speed stream cleaning can be carried out. In this cleaning apparatus, a tube in which a semiconductor device 21 (a material to be cleaned) is disposed is narrowed in a closed type processing bath 20, whereby a flow speed of a cleaning solution 22 circulated by means of a pump 8 is accelerated to clean the material to be cleaned.

A temperature in carrying out the cleaning method of the present invention shall not specifically be restricted and falls in a range of usually a room temperature to 90° C., and it can suitably be selected according to the etching conditions and the semiconductor substrate used.

The semiconductor substrate which can be used in the cleaning method of the present invention includes, for example, organic materials such as polyimides and acryl resins, semiconductor wiring materials such as silicon, amorphous silicon, polysilicon, a silicon oxide film, a silicon nitride film, aluminum, aluminum alloys, copper, copper alloys, titanium, titanium-tungsten, titanium nitride, tungsten, tantalum, tantalum compounds, chromium, chromium oxide, chromium alloys and ITO (indium-tin oxide), compound semiconductors such as gallium-arsenic, gallium-phosphorus and indium-phosphorus and a glass substrate for LCD.

The cleaning method of the present invention is used in peeling a resist film coated on a semiconductor substrate or the resist film remaining after etching the resist film coated on the semiconductor substrate, and a supersonic wave can be used as well, if necessary, in combination therewith.

An organic solvent such as alcohol does not have to be used for rinsing after peeling the residues on the surface of the material to be treated on the semiconductor substrate by the cleaning method of the present invention, and it is enough to carry out rinsing only with water.

As explained above in details, cleaning of a material to be treated by the cleaning agent or the cleaning method of the present invention makes it unnecessary to use an organic solvent such as alcohol as a rinsing solution and makes it possible to rinse it only with water, and deposits adhering firmly to the surface of the material to be treated can readily be removed without damaging the material to be treated.

The present invention shall more specifically be explained with reference to examples and comparative examples, but the present invention shall by no means be restricted by these examples.

Figure 3:
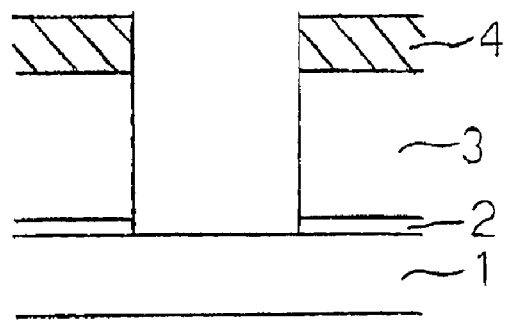
FIG. 3 represents a drawing showing the semiconductor device used in the examples and the comparative examples.

The samples of the semiconductor devices used in the examples and the comparative examples were produced in the following manner. As shown in FIG. 3, a silicon nitride film 2 and a silicon oxide film 3 were deposited laminated in order on a copper wiring matter 1 in lower layer by a CVD method, and then a resist 4 was coated thereon to process the resist by means of a conventional photo technique. Thereafter, a dry etching technique was used to process the silicon nitride film 2 and the silicon oxide film 3 into a desired pattern by etching.

EXAMPLES 1 TO 15 AND COMPARATIVE EXAMPLES 1 TO 6

Figure 2:
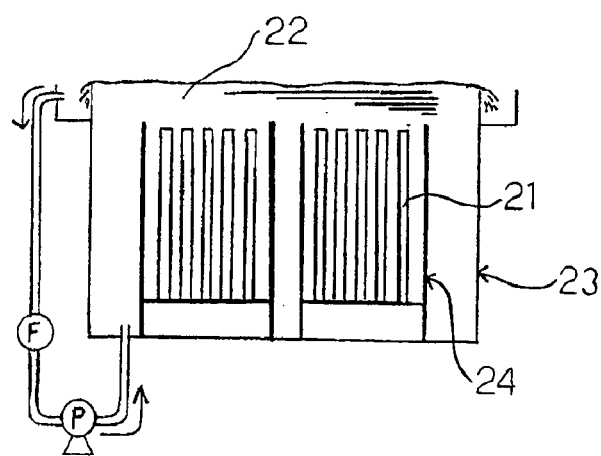
FIG. 2 is a drawing showing a dipping batch type cleaning apparatus for conventionally cleaning a semiconductor device.

Cleaning agents having compositions shown in Tables 1 and 2 were used to clean the semiconductor devices described above in cleaning conditions shown in Tables 1 and 2, wherein a dipping batch type cleaning apparatus (refer to FIG. 2) having a relatively slow flow speed was used in the case of Examples 1 to 5 and Comparative Examples 1 to 4, and a dipping single layer type cleaning apparatus (refer to FIG. 1) having a high flow speed was used in the case of Examples 6 to 15 and Comparative Examples 5 to 6.

After cleaning, the semiconductor devices were rinsed with ultra purified water and dried. Then, the surface states thereof were observed under an optical microscope and a scanning electron microscope (SEM) to evaluate a peeling state of the resists and a corrosion state of the copper wirings and the silicon oxide films according to the following judging criteria. The results thereof are shown in Tables 1 and 2.

Peeling State:
⊙: completely removed
○: almost completely removed
Δ: partially remained
X: remained in large part
Corrosion State:
⊙: corrosion was not observed at all
○: corrosion was scarcely observed
Δ: corrosion was observed in a crater form or a pit form
X: corrosion of the copper layer or the silicon oxide film was observed

TABLE 1

| | Composition of cleaning agent | | | | Cleaning condition | | | | | |
|---|---|---|---|---|---|---|---|---|---|---|
| | Organic solvent | | Surfactant | | | | | | | |
| Example | Kind | Content (wt %) | Kind | Content (wt %) | Temperature (° C.) | Time (minute) | Solution flow speed(cm/second) | Peeling state of resist | Corrosion state of copper | Corrosion state of silicon oxide film |
| 1 | DMS | 99.9 | Plysurf A207H | 0.1 | 70 | 3 | 2 | Δ | ⊚ | ⊚ |
| 2 | DMS | 99.9 | Plysurf A207H | 0.1 | 50 | 5 | 2 | Δ | ⊚ | ⊚ |
| 3 | DMS | 99.9 | Plysurf A217C | 0.1 | 50 | 5 | 2 | Δ | ⊚ | ⊚ |
| 4 | DMF | 99.9 | Plysurf A217C | 0.1 | 70 | 3 | 2 | Δ | ⊚ | ⊚ |
| 5 | DMS | 80 | Plysurf A207H | 20 | 70 | 3 | 2 | Δ | ⊚ | ⊚ |
| 6 | DMS | 99.9 | Plysurf A207H | 0.1 | 70 | 3 | 5 | ○ | ⊚ | ⊚ |
| 7 | DMS | 99.9 | Plysurf A207H | 0.1 | 50 | 5 | 5 | ○ | ⊚ | ⊚ |
| 8 | DMS | 99.9 | Plysurf A217C | 0.1 | 50 | 5 | 5 | ○ | ⊚ | ⊚ |
| 9 | DMF | 99.9 | Plysurf A217C | 0.1 | 70 | 3 | 5 | ○ | ⊚ | ⊚ |
| 10 | DMS | 80 | Plysurf A207H | 20 | 70 | 3 | 5 | ○ | ⊚ | ⊚ |
| 11 | DMS | 99.9 | Plysurf A207H | 0.1 | 70 | 3 | 10 | ⊚ | ⊚ | ⊚ |
| 12 | DMS | 99.9 | Plysurf A207H | 0.1 | 50 | 5 | 10 | ⊚ | ⊚ | ⊚ |
| 13 | DMS | 99.9 | Plysurf A217C | 0.1 | 50 | 5 | 10 | ⊚ | ⊚ | ⊚ |
| 14 | DMF | 99.9 | Plysurf A217C | 0.1 | 70 | 3 | 10 | ⊚ | ⊚ | ⊚ |
| 15 | DMS | 80 | Plysurf A207H | 20 | 70 | 3 | 10 | ⊚ | ⊚ | ⊚ |

DMS: Dimethylsulfoxide
DMF: N,N-dimethylformamide

TABLE 2

| | Composition of cleaning agent | | | | Cleaning condition | | | | | |
|---|---|---|---|---|---|---|---|---|---|---|
| | Organic solvent | | Alkanolamine | | | | | | | |
| Comparative Example | Kind | Content (wt %) | Kind | Content (wt %) | Temperature (° C.) | Time (minute) | Solution flow speed(cm/second) | Peeling state of resist | Corrosion state of copper | Corrosion state of silicon oxide film |
| 1 | DMS | 100 | — | — | 50 | 5 | 2 | X | ○ | ○ |
| 2 | DMS | 70 | MEA | 30 | 70 | 3 | 2 | X | X | Δ |
| 3 | DMS | 100 | — | — | 50 | 5 | 5 | X | ○ | ○ |
| 4 | DMS | 70 | MEA | 30 | 70 | 3 | 5 | Δ | X | Δ |
| 5 | DMS | 100 | — | — | 50 | 5 | 10 | Δ | ⊚ | ⊚ |
| 6 | DMS | 70 | MEA | 30 | 70 | 3 | 10 | ⊚ | X | ○ |

DMS: Dimethylsulfoxide
MEA: Monoethanolamine

As shown in Table 1, in Examples 1 to 15 to which the cleaning method of the present invention was applied, copper and the silicon oxide films were not corroded at all, and the resists were excellent in a peeling state. The resists were completely removed particularly in Examples 11 to 15 in which cleaning was carried out with a high speed stream.

As explained above in details, cleaning of a material to be treated by the cleaning agent of the cleaning method of the present invention makes it unnecessary to use an organic solvent such as alcohol as a rinsing solution and makes it possible to rinse it only with water, and firm deposits on the surface of the material to be treated can readily be removed without damaging the material to be treated.

What is claimed is:

1. A cleaning agent consisting of a surfactant and an organic solvent, wherein:
    the surfactant includes at least one anionic surfactant selected from the group consisting of anionic esters of phosphoric acid represented by the following formula:

$R^1O(CH_2CH_2O)_mPO(OR^2)(OH)$ wherein $R^1$ represents an alkyl group or an alkylaryl group; $R^2$ represents H or a $R^3O(CH_2CH_2O)_n$ group; $R^3$ represents an alkyl group or an alkylaryl group, and $R^1$ and $R^3$ may be the same or different; and m and n represent integers; and the organic solvent is at least one compound selected from the group consisting of ethylene glycol monoethyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, propylene glycol monobutyl ether, dipropylene glycol monomethyl ether, dipropylene glycol monoethyl ether, dipropylene glycol monobutyl ether, diethylene glycol dimethyl ether, dipropylene glycol dimethyl ether, formamide, monomethylformamide, dimethylformamide, monoethlyformamide, diethylformamide, acetamide, monomethylacetamide, N-methylpyrrolidone, N-ethylpyrrolidone, N,N-dimethylformamide, N,N-dimethylacetamide, dimethyl sulfoxide, dimethyl sulfone, diethyl sulfone, bis (2-hydroxysulfone), tetramethylene sulfone, methanol, ethanol, 1-propanol, 2-propanol, 1-hexanol, 1-nonanol, cyclohexanol and benzyl alcohol.

2. The cleaning agent according to claim 1, wherein the amount of the surfactant is 0.01 to 20% by weight and the amount of the organic solvent is 80 to 99.9% by weight, each based on the amount of the cleaning agent.

3. The cleaning agent according to claim 1, wherein the organic solvent is at least one compound selected from the group consisting of dimethyl sulfoxide, N,N-dimethylformamide, N,N-dimethylacetamide, N-methylpyrrolidone, diethylene glycol monomethyl ether, diethylene glycol monobutyl ether, methanol and benzyl alcohol.

4. The cleaning agent according to claim 3, wherein the amount of the surfactant is 0.01 to 20% by weight and the amount of the organic solvent is 80 to 99.9% by weight, each based on the amount of the cleaning agent.

5. The cleaning agent according to claim 1, wherein the organic solvent is at least one compound selected from the group consisting of dimethyl sulfoxide and N,N-dimethylformamide.

6. The cleaning agent according to claim 5, wherein the amount of the surfactant is 0.01 to 20% by weight and the amount of the organic solvent is 80 to 99.9% by weight, each based on the amount of the cleaning agent.

7. A cleaning method comprising steps of:

holding a surface having thereon remaining resists in a closed processing bath which comprises an upstream portion, a narrow intermediate portion holding the surface, and a downstream portion, each of the upstream portion and the downstream portion having a cross-sectional area larger than that of the narrow intermediate portion;

passing a cleaning agent comprising a surfactant and an organic solvent through the upstream portion to flow said cleaning agent into the narrow intermediate portion of said processing bath, such that the cleaning agent is brought into contact with said surface at a high flow speed of 3 to 1000 cm/s, to remove the remaining resists;

flowing the cleaning agent out of the processing bath through the downstream portion; and circulating the cleaning agent out of the processing bath, and back into the processing bath, through a tube after passing through a reservoir of the cleaning agent, wherein the organic solvent is at least one compound selected from the group consisting of ethylene glycol monoethyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, propylene glycol monobutyl ether, dipropylene glycol monomethyl ether, dipropylene glycol monoethyl ether, dipropylene glycol monobutyl ether, diethylene glycol dimethyl ether, dipropylene glycol dimethyl ether, formamide, monomethylformamide, dimethylformamide, monoethlyformamide, diethylformamide acetamide, monomethylacetamide, N-methylpyrrolidone, N-ethylpyrrolidone, N,N-dimethylformamide, N-N, dimethylacetamide, dimethyl sulfoxide, dimethyl sulfone, diethyl sulfone, bis(2-hydroxysulfone), tetramethylene sulfone, methanol, ethanol, 1-propanol, 2-propanol, 1-hexanol, 1-nonanol, cyclohexanol and benzyl alcohol, and wherein the surfactant includes at least one anionic surfactant selected from the group consisting of anionic esters of phosphoric acid represented by the following formula:

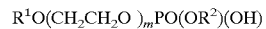

$R^1O(CH_2CH_2O)_mPO(OR^2)(OH)$ wherein $R^1$ represents an alkyl group or an alkylaryl group; $R^2$ represents H or a $R^3O(CH_2CH_2O)_n$ group; $R^3$ represents an alkyl group or an alkylaryl group, and $R^1$ and $R^3$ may be the same or different; and m and n represent integers.

8. The cleaning method according to claim 7, wherein the closed processing bath includes a closed narrow space of less than one liter, into which the cleaning agent is circulated at a flow rate of 1 liter/s or more, thereby attaining the high flow speed of the cleaning agent on the surface having thereon remaining resists.

9. The cleaning method according to claim 7, wherein the high flow speed is attained by allowing the cleaning agent to flow into the intermediate portion in which the surface having the remaining resists thereon is held, having the decreased cross-sectional area as compared with the cross-sectional area of the upstream and downstream portions of the closed processing bath.

10. The cleaning method according to claim 7, wherein the surface is a surface of a semiconductor device.

11. The cleaning method according to claim 7, wherein the amount of the surfactant is 0.01 to 20% by weight and the amount of the organic solvent is 80 to 99.9% by weight, each based on the amount of the cleaning agent.

12. The cleaning method according to claim 7, wherein the organic solvent is at least one compound selected from the group consisting of dimethyl sulfoxide, N,N-dimethylformamide, N,N-dimethylacetamide, N-methylpyrrolidone, diethylene glycol monomethyl ether, diethylene glycol monobutyl ether, methanol and benzyl alcohol.

13. The cleaning method according to claim 12, wherein the amount of the surfactant is 0.01 to 20% by weight and the amount of the organic solvent is 80 to 99.9% by weight, each based on the amount of the cleaning agent.

14. The cleaning method according to claim 7, wherein the organic solvent is at least one compound selected from the group consisting of dimethyl sulfoxide and N,N-dimethylformamide.

15. The cleaning method according to claim 14, wherein the amount of the surfactant is 0.01 to 20% by weight and the amount of the organic solvent is 80 to 99.9% by weight, each based on the amount of the cleaning agent.

16. The cleaning method according to claim 7, wherein the cleaning agent consists of said surfactant and said organic solvent.

17. The cleaning method according to claim 7, wherein after bringing said cleaning agent into contact with said surface, said surface is rinsed using only water.

18. The cleaning method according to claim 7, wherein after bringing said cleaning agent into contact with said surface, said surface is rinsed using water and without using an organic solvent.

* * * * *